(12) United States Patent
Beaudoux

(10) Patent No.: US 11,539,358 B2
(45) Date of Patent: Dec. 27, 2022

(54) CIRCUIT FOR PROTECTING A SWITCH

(71) Applicant: Valeo Siemens eAutomotive France SAS, Cergy (FR)

(72) Inventor: Benoît Beaudoux, Paris (FR)

(73) Assignee: VALEO SIEMENS EAUTOMOTIVE FRANCE SAS, Cergy (FR)

(*) Notice: Subject to any disclaimer, the term of this patent is extended or adjusted under 35 U.S.C. 154(b) by 0 days.

(21) Appl. No.: 17/054,229

(22) PCT Filed: May 10, 2019

(86) PCT No.: PCT/EP2019/062049
§ 371 (c)(1),
(2) Date: Nov. 10, 2020

(87) PCT Pub. No.: WO2019/219530
PCT Pub. Date: Nov. 21, 2019

(65) Prior Publication Data
US 2021/0099166 A1  Apr. 1, 2021

(30) Foreign Application Priority Data

May 17, 2018 (FR) ...................................... 1854142

(51) Int. Cl.
*H03K 17/082* (2006.01)

(52) U.S. Cl.
CPC ..... *H03K 17/0822* (2013.01); *H03K 17/0828* (2013.01)

(58) Field of Classification Search
CPC .......................................... H03K 17/08–0828
See application file for complete search history.

(56) References Cited

U.S. PATENT DOCUMENTS 3,048,718 A * 8/1962 Starzec ................... G05F 1/571
361/91.6
5,266,882 A * 11/1993 Morishita ................. H02J 7/14
322/28

(Continued)

FOREIGN PATENT DOCUMENTS

CN  203011996 U  *  6/2013
FR  3053206 A1    12/2017

OTHER PUBLICATIONS

Translation of CN-203011996-U. Jun. 19, 2013. (Year: 2013).*
International Search Report for PCT Serial No. PCT/EP2019/062049 dated Aug. 6, 2019.

*Primary Examiner* — Jared Fureman
*Assistant Examiner* — Christopher J Clark
(74) *Attorney, Agent, or Firm* — McCormick, Paulding & Huber PLLC

(57) ABSTRACT

The present invention relates to a circuit for protecting a switch of an electrical system, said protecting circuit comprising a variable electronic component having a physical characteristic the value of which varies by at least 10% as a function of temperature, the protecting circuit being configured to prohibit a current from passing through said switch when the intensity of said current exceeds a maximum allowed intensity threshold, said variable electronic component being connected in the protecting circuit such that the value of the maximum allowed intensity threshold is directly a function of said physical characteristic.

7 Claims, 3 Drawing Sheets

(56) References Cited

U.S. PATENT DOCUMENTS

| | | | |
|---|---|---|---|
| 5,343,137 A * | 8/1994 | Kitaoka | H02H 7/18 307/10.7 |
| 6,060,834 A | 5/2000 | Vilkinofsky et al. | |
| 2003/0123205 A1 | 7/2003 | Ashiya | |

* cited by examiner

CIRCUIT FOR PROTECTING A SWITCH

CROSS-REFERENCE TO RELATED APPLICATIONS

This application is a National Stage application of International Patent Application No. PCT/EP2019/062049, filed on May 10, 2019, which claims priority to French Patent Application No. 1854142 filed on May 17, 2018, each of which is hereby incorporated by reference in its entirety.

TECHNICAL FIELD

The present invention relates to an electrical system comprising a switch and electronic means for protecting said switch against overcurrents.

In particular, the present invention relates to the field of automotive vehicles, in particular electric or hybrid vehicles. More precisely, within the context of an electric or hybrid vehicle comprising a high voltage power battery and an electric machine for propelling the vehicle, it is known that a power inverter is used to convert a direct current provided by said power battery into a plurality of alternating currents for controlling said electric machine. The present invention relates, within this context, to electric equipment, in particular of the power inverter type, comprising at least a switch and a device for protecting said switch against overcurrents, the invention enabling said protecting device to adapt switch protection, in real time, as a function of the temperature.

BACKGROUND

As is known, electric vehicles carry power inverters, in other words direct current-polyphase, in particular three-phase, current converters, to power an electric machine for example belonging to an electric or hybrid motor system.

Such power inverters comprise a plurality of components, including switches, which have to operate over a wide range of temperature values, for example ranging from −40° C. to +105° C. Switches, in particular of the IGBT (Insulated Gate Bipolar Transistor) type or even MOSFET (Metal Oxide Semiconductor Field Effect Transistor) type are controlled to control energy transfers between an input and an output of said converters.

Such switches have a maximum permissible voltage at their terminals, in other words a breakdown voltage. Beyond said maximum permissible voltage, said switches can be damaged, or even destroyed, hence making the power inverter inoperative.

In FIG. 1, an example of a circuit CC1 for controlling an IGBT or MOSFET type transistor T1 has been represented. In such a circuit, the control signal S1 of the transistor T1 is provided, through a driver BF, to the gate G of the transistor T1 through a so-called gate resistance Rg the value of which influences the transistor operation. More precisely, when the gate resistance Rg value is low, the transistor quickly switches, which enables low switching losses and thus a good efficiency to be achieved, but can cause overvoltages (related to the stray inductances of the circuit), that can destroy the component and electromagnetic disturbance levels not complying with standards. Reversely, when the gate resistance Rg value is high, the transistor T1 switches less quickly, which causes high losses (when closing and opening) because of switching times which are longer, but this enables lower overvoltages and lower electromagnetic disturbance levels to be achieved. Thus, choosing the optimum resistance Rg is a compromise between losses, which impact efficiency, and overvoltages, which can result in destroying the transistor T1 and increasing electromagnetic disturbance levels.

At high temperatures, for example in the order of −105° C., the breakdown voltage of an IGBT or MOSFET transistor is generally higher than at 25° C., at which temperature the breakdown voltage is set out in the data sheet of the component. On the other hand, at low temperatures, for example in the order of −40° C., the breakdown voltage of an IGBT or MOSFET transistor is lower, in the order of 5 to 7% the breakdown voltage at 25° C. Hence, a low value for the gate resistance Rg at a negative temperature can generate overvoltages the value of which would be higher than the breakdown voltage, thus causing the transistor T1 to be destroyed, making the power inverter inoperative.

To sum up, the breakdown voltage of a switch is dependent on temperature. In practice, the maximum permissible voltage at the terminals of a switch thus increases with temperature.

According to the state of the art, a solution to this problem consists in configuring the circuit for controlling such switches so that no voltage higher than the breakdown voltage is applied to the terminals of the switch in question. Said control circuit thus actually provides a protection function for the switch against overcurrents. For that purpose, a maximum intensity threshold for the current, allowed to pass through the switch, is predefined, as a function of the breakdown voltage Vbr and in accordance with the best compromise determined according to previously set forth principles. In the state of the art, said threshold Vc is constant, as shown in FIG. 2, such that the operating zone Z1 in which the corresponding switch optimally operates is significantly reduced.

Since the breakdown voltage of a switch is lower at a low temperature, according to the state of the art, the worst use case contemplated is thus considered, typically at −40° C., to set said fixed threshold.

There is thus a need for a circuit for protecting a switch of a voltage converter, in particular a power inverter, which enables the maximum voltage threshold permitted at the terminals of said switch to be optimised, while allowing as quick as possible switching of said switch, in order to minimise losses without exceeding the maximum permissible voltage at the terminals of said switch, in other words without exceeding the maximum intensity of the current allowed to pass through said switch, whatever the temperature.

SUMMARY

For that purpose, the invention is directed to a circuit for protecting a switch of an electrical system, said protecting circuit comprising a variable electronic component having a physical characteristic the value of which varies by at least 10% as a function of temperature, the protecting circuit being configured to prohibit a current from passing through said switch when the intensity of said current exceeds a maximum allowed intensity threshold, said variable electronic component being connected in the protecting circuit such that the value of the maximum allowed intensity threshold is directly a function of said physical characteristic.

Especially, the switch is an electronic switch, in particular a semiconductor switch, such as a transistor.

By means of the present invention, the optimum operating zone Z2 of the protected switch is extended, with reference to FIG. 3.

According to one embodiment, said variable electronic component is a thermo-resistor.

According to one embodiment, said variable electronic component is a negative thermal coefficient thermo-resistor.

According to one embodiment, said variable electronic component is a positive thermal coefficient thermo-resistor.

According to one embodiment, the protecting circuit comprises a first comparator for comparing a voltage as a function of the current for flowing in the switch with a first variable voltage threshold directly depending on the physical characteristic of the variable electronic component.

According to one embodiment, the protecting circuit comprises a second comparator, for comparing a voltage as a function of the current for flowing in the switch with a second variable voltage threshold directly depending on the physical characteristic of the variable electronic component, the first threshold being positive and the second threshold being negative.

According to one embodiment, the protecting circuit comprises at least one Zener diode configured to limit the first threshold and/or second threshold to a maximum absolute value.

The present invention is also directed to an electrical system comprising at least one switch having a maximum permissible voltage at its terminals depending on temperature, comprising a shutdown member configured to prohibit a current having an intensity higher than a current threshold, from passing through a terminal of the switch, said system comprising a protecting circuit as previously described above, configured to control the shutdown member.

The present invention is further directed to a power inverter, especially to power an electric machine of a motor system of an electric or hybrid automotive vehicle, comprising an electrical system as briefly described above.

BRIEF DESCRIPTION OF THE DRAWINGS

The invention will be better understood upon reading the description that follows, given by way of example only, and referring to the appended drawings which represent.

DETAILED DESCRIPTION

Figure 1:
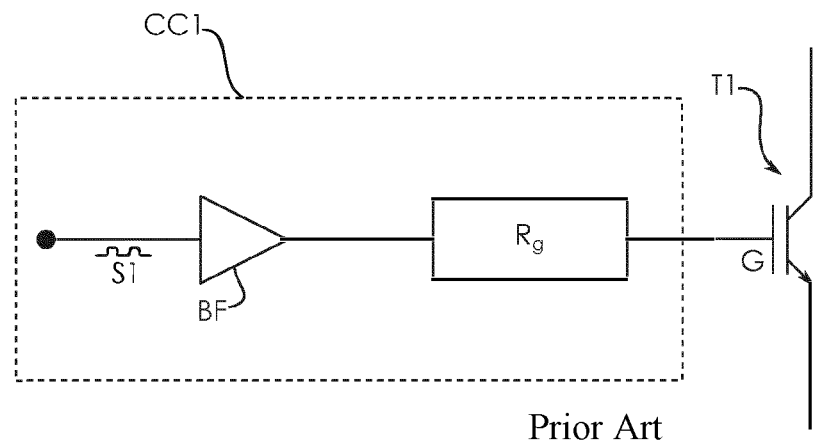
FIG. 1, the diagram of a circuit for controlling an IGBT or MOSFET transistor according to the state of the art, FIG. 2, the chart showing a fixed intensity protection threshold of a switch, according to the state of the art, FIG. 3, the chart showing a variable intensity protection threshold of a switch, according to the invention, FIG. 4, an example of protecting circuit according to the invention, FIG. 5, another example of protecting circuit according to the invention.
Figure 2:
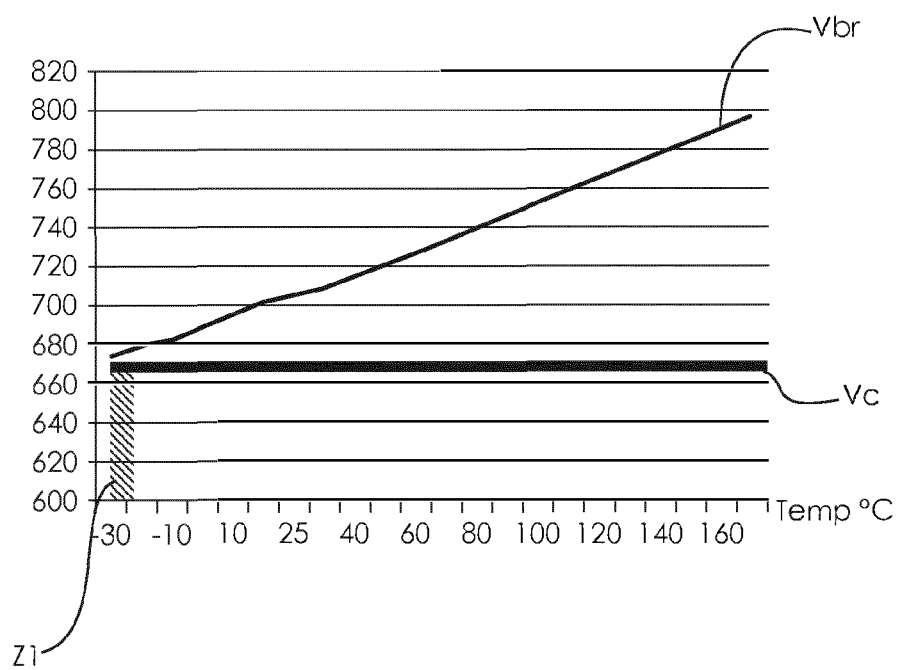

It is reminded that the present invention is described hereinafter using different non-limiting embodiments and is likely to be implemented in alternatives within the knowledge of those skilled in the art, at which the present invention is also directed.

In what follows, one implementation of the protecting circuit according to the invention is in particular directed at, within the context of a vehicle power inverter.

In the example described hereinafter, the vehicle especially comprises an electric machine, an electric equipment having the form of a power inverter, a high voltage power battery, an on-board high voltage electric network, a low voltage power battery, an on-board low voltage electric network and a plurality of auxiliary electric equipments.

The electric equipment according to the invention is described hereinafter in its implementation for a power inverter, without however limiting the scope of the present invention. It will be thus noted that the electric equipment could be other than a power inverter, for example a charger or DCDC converter on-board the vehicle.

The on-board low voltage electric network connects the low voltage power battery and the plurality of auxiliary electric equipments such that the low voltage power battery powers said auxiliary electric equipments, such as on-board calculators, window lift motors, a multimedia system, etc. The low voltage power battery typically delivers for example a voltage in the order of 12V, 24V or 48V. Charging the low voltage battery is performed from the high voltage battery via a DC voltage-DC voltage converter commonly called a DC-DC converter.

The on-board high voltage electric network connects the high voltage power battery and the power inverter such that the high voltage power battery provides energy supply function for the electric machine via the power inverter. The high voltage power battery typically delivers a voltage between 100V and 900V, preferably between 100V and 500V. Charging the high voltage power battery with electric energy is performed by connecting it, via the DC high voltage electric network of the vehicle, to an external electric network, for example home alternating electrical system.

The electric machine is a rotary electric machine, preferably for driving the vehicle wheels from energy provided by the high voltage power battery. More precisely, the electric machine is an alternating current electric machine powered by a polyphase current source. For example, the electric machine can be an alternating current motor. In the preferred example described hereinafter, the electric machine is powered by a three-phase current source without limiting the scope of the present invention thereto.

In this example, controlling the electric machine is performed by means of the power inverter. Said power inverter enables the direct current provided by the high voltage power battery to be converted into three alternating control currents, for example sinusoidal currents. In other words, the function of the power inverter is to transform the direct current input by the high voltage power battery into three phase currents enabling the electric machine to be controlled. Reversely, in another operating mode, the electric machine can also provide three alternating currents to the power inverter such that said power inverter transforms them into a direct current enabling the high voltage power battery to be charged.

The power inverter comprises a casing to which power electronic components are mounted, through which energy powering the electric machine passes, especially for transforming direct current into alternating currents or vice-versa, and a control unit controlling said power electronic components.

These power electronic components especially comprise electronic switches such as transistors, in particular IGBT or MOSFET type semiconductor transistors, arranged as an electric circuit and controlled in opening and closing by control circuits for electric energy to controllably pass between the high voltage power battery and electric machine.

The electronic unit for controlling the power inverter comprises components for controlling power electronic components, especially transistors. More precisely, the electronic control unit controls power electronic components such that they perform conversion function of direct current received from the low voltage battery, defining a direct voltage, into three alternating phase currents for controlling the electric machine (or vice-versa).

According to the invention, a protecting circuit for said switches of an electronic control unit of an electric system, especially a power inverter is provided.

Figure 3:
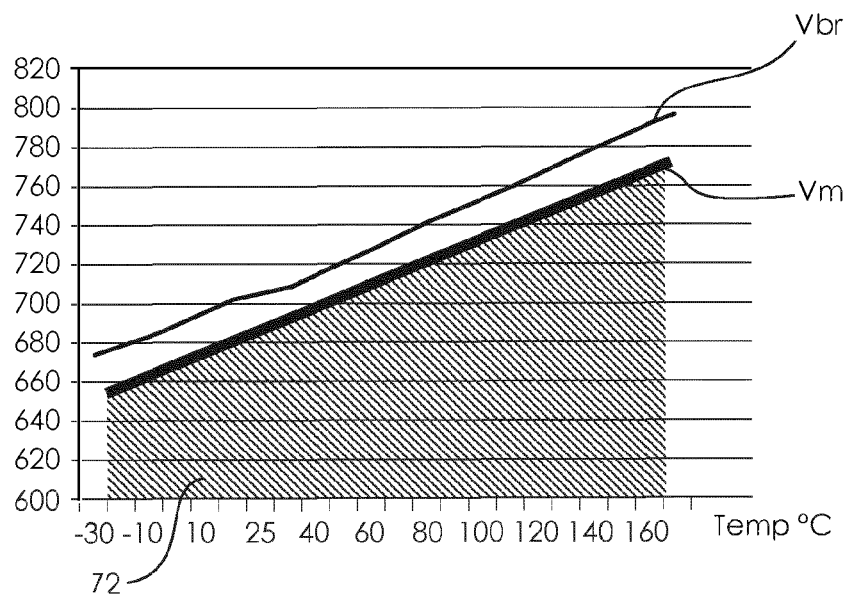

In accordance with the invention, as shown in FIG. 3, the maximum voltage threshold Vm allowed at the terminals of said switches of the electric system is adapted in real time as a function of temperature.

For example, the lower the temperature, the more reduced the maximum voltage threshold Vm allowed at the terminals of a switch, and thus the more reduced the power transferable by said switch.

It is to be noted that the decrease in the maximum power the switch is able to transfer implies a drop in the power available for the electric machine powered by said converter, but it is specified that the performance of an electric machine is anyway generally restricted when cold, because, when cold, the magnetic field at the stator of the rotary electric machine in question reduces magnetic performance of the permanent magnet rotor of said electric machine.

According to the same example, when hot, reversely, the maximum voltage threshold allowed at the terminals of the switch can be increased, enabling more power to be transferred to the electric machine.

By means of the protecting circuit according to the invention, the maximum voltage threshold allowed at the terminals of the switch is thus adapted in real time, intrinsically, namely without resorting to software especially, as a function of temperature.

In other words, the maximum intensity threshold of the current allowed to pass through the switch intrinsically varies as a function of temperature.

Conventionally, when the maximum intensity threshold of the current allowed to pass through the switch, corresponding to an intensity for which the breakdown voltage cannot be exceeded, is reached, a shutdown member is controlled to open the circuit in order to ensure that said current will not pass through said switch.

Figure 4:
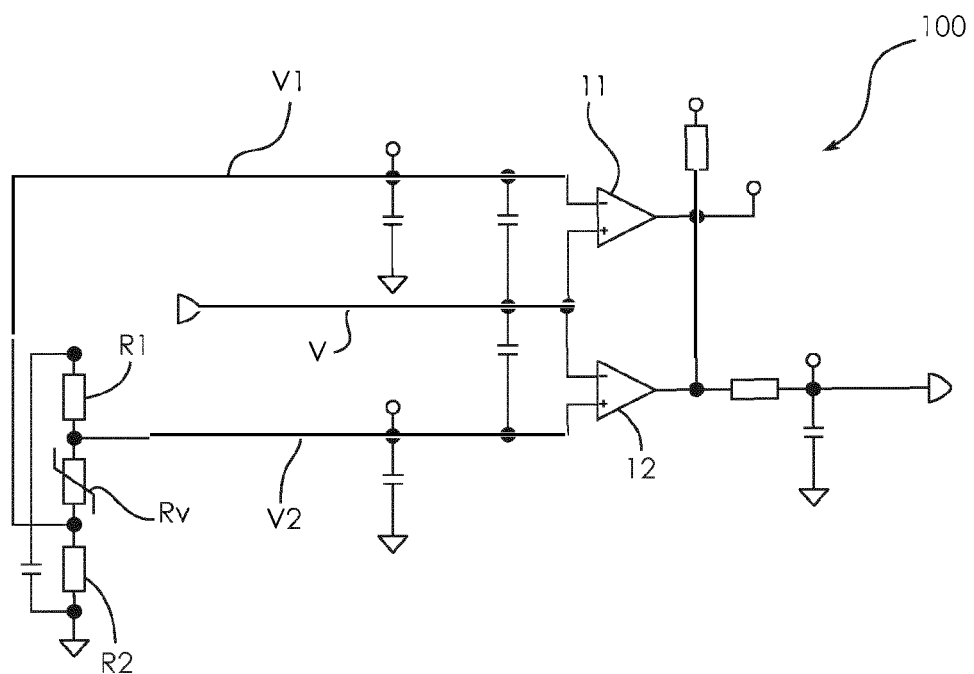

This limitation of the maximum voltage allowed at the terminals of the switch is made, according to the invention, through electronic means, in other words hardware as opposed to software means. FIG. 4 shows an example of such a circuit for protecting a switch against overcurrents, said circuit being able to intrinsically adapt herein two maximum intensity thresholds of the current allowed to pass through the switch, one of the thresholds being positive and the other negative.

For that purpose, with reference to FIG. 4, a further electronic component Rv is integrated into the protecting circuit 100, said further electronic component Rv having an electrical characteristic, in particular a resistance, which varies as a function of temperature.

The further electronic component according to the invention is variable, namely it has a physical characteristic the value of which significantly varies by at least 10% as a function of temperature. It is intended that this 10% variation of said physical characteristic is achieved over a range of temperatures of the environment in which the electric machine is likely to be used, that is concerning a vehicle, a range of temperatures from about −50° C. to +50° C.

According to the embodiment represented in FIG. 4, said variable electronic component is a variable thermo-resistor Rv. For example, said variable thermo-resistor can be of the NTC (Negative Thermal Coefficient) type, or of the PTC (Positive Thermal Coefficient) type.

Still with reference to the embodiment represented in FIG. 4, at least one variable thermo-resistor Rv, the resistance value of which varies as a function of temperature, is thus connected in the protecting circuit 100.

According to the embodiment chosen, the variable thermo-resistor Rv cooperates, by forming voltage dividing bridges, with the fixed resistors R1, R2 so as to adapt the voltage thresholds V1, V2 respectively input to the comparators 11 and 12.

In the example of FIG. 4, the protecting circuit 100 of a switch against overcurrents thus comprises three resistors R1, R2, Rv, the variable thermo-resistor Rv of which forms two voltage dividing bridges connected between electric ground and, respectively, a terminal of a first and a second comparator 11 and 12. The implementation of both comparators 11, 12 enables a measured voltage V as a function of the intensity of the current passing through the switch with two thresholds V1, V2 to be compared, one being for example negative V1 and the other positive V2.

Alternatively, it is to be noted that the protecting circuit according to the invention can be implemented within a context where a single current threshold is analysed, by means of a single comparator. In this case, only two resistors, including the variable thermo-resistor Rv, are connected between electric ground and an input of the comparator, to compare the voltage as a function of the intensity of the current passing through the switch with a single, positive or negative, threshold.

The comparators 11, 12 compare a voltage V which is a function of the intensity of the current passing through the protected switch with each of both thresholds V1, V2 from the voltage dividing bridges comprising the variable thermo-resistor Rv. Said thresholds V1, V2 are consequently intrinsically variable as a function of temperature.

In sum up, according to the invention, the maximum intensity threshold from which the protecting circuit orders a shutdown member to open the circuit to prevent the current from passing through the switch is set such that, for example, said threshold linearly increases with temperature.

However, it is of course possible to make an arrangement according to which said current threshold(s) to which the protecting circuit orders a shutdown member to open the circuit to prevent the current from passing through the switch, can vary differently as a function of temperature.

The current threshold can thus decrease with temperature, or even non-linearly varies with temperature. In this case, for example, one or more Zener diodes can be added to the shutdown circuit 100 so as to limit the threshold to which the protecting circuit orders a shutdown member to open the circuit to prevent the current from passing through the switch, for example when the temperature is high.

Figure 5:
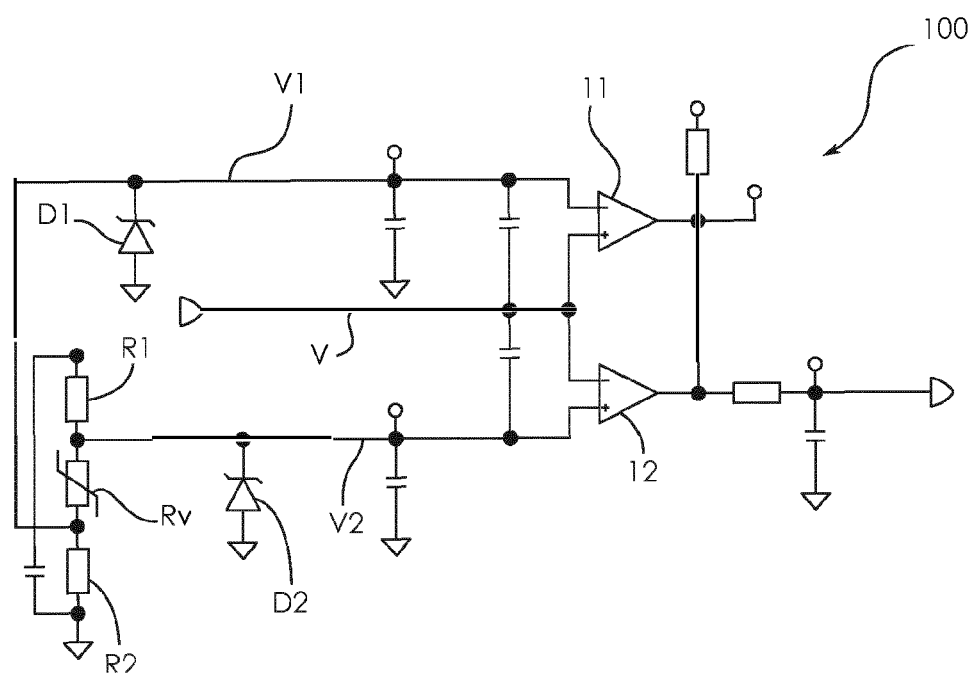

With reference to FIG. 5, two Zener diodes D1, D2 can be connected between electric ground of the shutdown circuit 101 and, respectively, a terminal of the first 11 and second 12 comparators to which the negative threshold V1 and the positive threshold V2 from the dividing bridges formed by the resistors R1, R2, Rv are connected respectively.

The Zener diodes D1, D2 are for limiting the thresholds V1, V2 with which the voltage V measured which is a function of the intensity of the current passing through the protected switch is compared.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A protecting circuit for protecting a switch of an electrical system, said protecting circuit comprising a variable electronic component having a physical characteristic the value of which varies by at least 10% as a function of temperature, the protecting circuit being configured to prohibit a current from passing through said switch when the intensity of said current exceeds a maximum allowed intensity threshold, said variable electronic component being connected in the protecting circuit such that the value of the maximum allowed intensity threshold is directly a function of said physical characteristic,
wherein the protecting circuit for protecting a switch of an electrical system further comprises:
a first comparator, comparing a voltage as a function of the current flowing in the switch with a first variable voltage threshold directly depending on the physical characteristic of the variable electronic component, and
a second comparator, for comparing a voltage as a function of the current flowing in the switch with a second variable voltage threshold directly depending on the physical characteristic of the variable electronic component, the first variable voltage threshold being positive and the second variable voltage threshold being negative.

2. The protecting circuit according to claim 1, wherein said variable electronic component is a thermo-resistor.

3. The protecting circuit according to claim 1, wherein said variable electronic component is a negative thermal coefficient thermo-resistor.

4. The protecting circuit according to claim 1, wherein said variable electronic component is a positive thermal coefficient thermo-resistor.

5. The protecting circuit according to claim 1, comprising a least one Zener diode configured to limit the first variable voltage threshold and/or second variable voltage threshold to a maximum absolute value.

6. An electrical system comprising at least one switch having a maximum permissible voltage at its terminals depending on temperature, comprising a shutdown member configured to prohibit a current having an intensity higher than a current threshold, from passing through a terminal of the switch, said system comprising a protecting circuit according to claim 1, configured to control the shutdown member.

7. A power inverter, especially to power an electric machine of a motor system of an electric or hybrid automotive vehicle, comprising an electrical system according to claim 6.

* * * * *